(12) United States Patent
Zeng et al.

(10) Patent No.: US 10,691,535 B2
(45) Date of Patent: Jun. 23, 2020

(54) FLASH MEMORY ERROR CORRECTION METHOD AND APPARATUS

(71) Applicant: Huawei Technologies Co., Ltd., Shenzhen (CN)

(72) Inventors: Yanxing Zeng, Hangzhou (CN); Jianqiang Shen, Hangzhou (CN); Gongyi Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 43 days.

(21) Appl. No.: 15/965,424

(22) Filed: Apr. 27, 2018

(65) Prior Publication Data

US 2018/0246782 A1 Aug. 30, 2018

Related U.S. Application Data

(63) Continuation of application No. PCT/CN2016/081723, filed on May 11, 2016.

(30) Foreign Application Priority Data

Nov. 30, 2015 (CN) .......................... 2015 1 0852721

(51) Int. Cl.
*G06F 11/00* (2006.01)
*G06F 11/10* (2006.01)
(Continued)

(52) U.S. Cl.
CPC .......... *G06F 11/1068* (2013.01); *G06F 3/061* (2013.01); *G06F 3/0679* (2013.01);
(Continued)

(58) Field of Classification Search
None
See application file for complete search history.

(56) References Cited

U.S. PATENT DOCUMENTS 8,947,929 B1 2/2015 Yang
9,633,740 B1 * 4/2017 Alhussien .............. G11C 16/28
(Continued)

FOREIGN PATENT DOCUMENTS

CN 102034547 A 4/2011
CN 102394113 A 3/2012
(Continued)

OTHER PUBLICATIONS

Machine Translation and Abstract of Chinese Publication No. CN102394113, Mar. 28, 2012, 12 pages.
(Continued)

*Primary Examiner* — Mujtaba M Chaudry
(74) *Attorney, Agent, or Firm* — Conley Rose, P.C.

(57) ABSTRACT

A flash memory error correction method and apparatus is provided. The method includes determining a first data bit in a flash memory page, where the first data bit corresponds to different data respectively in the data obtained by reading the flash memory page using the $(n+1)^{th}$ read voltage threshold and the data obtained by reading the flash memory page using the $m^{th}$ read voltage threshold; and then reducing a confidence level of the first data bit in the data obtained by reading the flash memory page using the $(n+1)^{th}$ read voltage threshold; and performing, according to an adjusted confidence level of the first data bit, error correction decoding on the data obtained by reading the flash memory page using the $(n+1)^{th}$ read voltage threshold. Present disclosure effectively improves a success rate of error correction decoding, thereby significantly improving performance of an SSD storage system.

20 Claims, 5 Drawing Sheets

(51) Int. Cl.
*G11C 29/42* (2006.01)
*G11C 11/56* (2006.01)
*G06F 3/06* (2006.01)
*G11C 16/26* (2006.01)
*G11C 16/34* (2006.01)
*G11C 29/52* (2006.01)
*H03M 13/25* (2006.01)

(52) U.S. Cl.
CPC .......... *G11C 11/5642* (2013.01); *G11C 16/26* (2013.01); *G11C 16/34* (2013.01); *G11C 29/42* (2013.01); *G11C 29/52* (2013.01); *H03M 13/255* (2013.01)

(56) References Cited

U.S. PATENT DOCUMENTS

| | | |
|---|---|---|
| 2008/0059868 A1 | 3/2008 | Cai et al. |
| 2011/0075484 A1* | 3/2011 | Lee .................... G11C 16/0408 365/185.17 |
| 2011/0083060 A1 | 4/2011 | Sakurada et al. |
| 2012/0079355 A1* | 3/2012 | Patapoutian ........ G06F 11/1048 714/780 |
| 2012/0284574 A1 | 11/2012 | Avila et al. |
| 2013/0275651 A1* | 10/2013 | D'Abreu ............. G11C 11/5628 711/103 |
| 2014/0169102 A1 | 6/2014 | Sun et al. |
| 2014/0185386 A1 | 7/2014 | Yang |
| 2014/0208189 A1 | 7/2014 | Parthasarathy et al. |
| 2014/0281771 A1 | 9/2014 | Yoon et al. |
| 2015/0074328 A1 | 3/2015 | Baryudin et al. |
| 2015/0149840 A1* | 5/2015 | Alhussien .......... H03M 13/1125 714/719 |
| 2015/0149871 A1* | 5/2015 | Chen .................. G06F 11/1068 714/773 |
| 2015/0186210 A1 | 7/2015 | Tsai |
| 2015/0200688 A1 | 7/2015 | Pan et al. |
| 2015/0331748 A1* | 11/2015 | Cohen ................. G06F 11/1012 714/764 |
| 2015/0332772 A1* | 11/2015 | Kim ...................... G11C 16/32 365/185.22 |
| 2016/0163382 A1* | 6/2016 | Conley ............... G11C 11/5642 365/185.03 |
| 2018/0012663 A1* | 1/2018 | Alhussien ............. G11C 16/26 |
| 2019/0130967 A1* | 5/2019 | Danjean ............. G11C 11/5642 |

FOREIGN PATENT DOCUMENTS

| | | |
|---|---|---|
| CN | 103380416 A | 10/2013 |
| CN | 103985415 A | 8/2014 |
| CN | 104052498 A | 9/2014 |
| CN | 104750571 A | 7/2015 |
| CN | 104937667 A | 9/2015 |
| WO | 2008121577 A1 | 10/2008 |

OTHER PUBLICATIONS

"Read Retry" Micron Technology, Inc., Feature Address 89th, Nov. 25, 2014, 6 pages.

Foreign Communication From a Counterpart Application, PCT Application No. PCT/CN2016/081723, English Translation of International Search Report dated Aug. 30, 2016, 2 pages.

Foreign Communication From a Counterpart Application, Chinese Application No. 201510852721.X, Chinese Office Action dated Jun. 5, 2019, 67 pages.

Foreign Communication From a Counterpart Application, European Application No. 16869553.4, Extended European Search Report dated Oct. 23, 2018, 9 pages.

* cited by examiner

FLASH MEMORY ERROR CORRECTION METHOD AND APPARATUS

CROSS-REFERENCE TO RELATED APPLICATIONS

This application is a continuation of International Patent Application No. PCT/CN2016/081723 filed on May 11, 2016, which claims priority to Chinese Patent Application No. 201510852721.X, filed on Nov. 30, 2015, both of which are hereby incorporated by reference in their entireties.

TECHNICAL FIELD

The present disclosure relates to computer technologies, and in particular, to a flash memory error correction method and apparatus.

BACKGROUND

As a flash memory technology continuously mature, the flash memory technology is widely applied to the field of solid-state storage. However, there may be multiple bit errors occurring in data stored in a flash memory. If data read from a flash memory physical page is directly returned to an upper-layer service, the service may fail.

Error checking and correction (ECC) protection needs to be performed on service data, that is, ECC coding is performed on the service data, and then the data obtained after the ECC coding is written into the flash memory in order to ensure that the data returned to the upper-layer service is correct and valid. Each time the data is read, ECC is performed on the data read from the flash memory in order to improve reliability of the service data.

However, an error correction capability of the ECC protection is limited, and can be effective only when a quantity of bit errors occurring in page data does not exceed a specific upper limit. If a quantity of incorrect bits in a read medium particle exceeds the error correction capability of the ECC error-correcting code, originally stored data information cannot be recovered using the error-correcting code, thereby causing a loss of the stored information.

To avoid the loss of the stored information, a solution frequently used in the other approaches is Read Retry, that is, a mechanism in which if the original information cannot be recovered using the error-correcting code after a status of a medium particle is read using a default read voltage threshold, the status of the medium particle is read again by adjusting the read voltage threshold and the original information is recovered using the error-correcting code.

In other approaches, the read voltage threshold needs to be adjusted many times to try to read data, thereby exponentially increasing a read delay (usually increasing from the order of microseconds to the order of milliseconds), and significantly degrading performance of a solid state drive (SSD) storage system.

SUMMARY

Embodiments of the present disclosure provide a flash memory error correction method and apparatus in order to resolve a prior-art problem that performance of an SSD storage system is significantly degraded because a read delay is exponentially increased.

According to a first aspect, an embodiment of the present disclosure provides a flash memory error correction method, including step 101: after error correction decoding performed on data that is of a flash memory page and that is read using an $n^{th}$ read voltage threshold fails, reading data of the flash memory page using an $(n+1)^{th}$ read voltage threshold, where the $(n+1)^{th}$ read voltage threshold is different from the $n^{th}$ read voltage threshold, and n is a positive integer greater than or equal to 1; step 102: determining a first data bit in the data obtained by reading the flash memory page using the $(n+1)^{th}$ read voltage threshold and data obtained by reading the flash memory page using an $m^{th}$ read voltage threshold, where the first data bit corresponds to different data respectively in the data obtained by reading the flash memory page using the $(n+1)^{th}$ read voltage threshold and the data obtained by reading the flash memory page using the $m^{th}$ read voltage threshold, and m is a positive integer greater than or equal to 1 and less than or equal to n; step 103: reducing a confidence level of the first data bit in the data obtained by reading the flash memory page using the $(n+1)^{th}$ read voltage threshold, where the confidence level is an absolute value of confidence corresponding to the first data bit; and step 104: performing, according to an adjusted confidence level of the first data bit, error correction decoding on the data obtained by reading the flash memory page using the $(n+1)^{th}$ read voltage threshold.

In this embodiment, two pieces of data obtained by reading a same flash memory page twice are jointly used, and a confidence level of a data bit corresponding to different data is reduced in order to effectively improve a success rate of error correction decoding and reduce a read delay, thereby significantly improving performance of an SSD storage system.

In some embodiments of the foregoing first aspect, the method may further include determining a second data bit in the data obtained by reading the flash memory page using the $(n+1)^{th}$ read voltage threshold and the data obtained by reading the flash memory page using the $m^{th}$ read voltage threshold, where the second data bit corresponds to same data respectively in the data obtained by reading the flash memory page using the $(n+1)^{th}$ read voltage threshold and the data obtained by reading the flash memory page using the $m^{th}$ read voltage threshold; and then improving a confidence level of the second data bit in the data obtained by reading the flash memory page using the $(n+1)^{th}$ read voltage threshold.

In the embodiments, the two pieces of data obtained by reading the same flash memory page twice are jointly used, the confidence level of the data bit corresponding to different data is reduced, and the confidence level of the data bit corresponding to the same data is improved, thereby further improving the success rate of error correction decoding.

In some embodiments of the foregoing first aspect, the determining a first data bit in the data obtained by reading the flash memory page using the $(n+1)^{th}$ read voltage threshold and data obtained by reading the flash memory page using an $m^{th}$ read voltage threshold further includes performing an exclusive OR operation on the data obtained by reading the flash memory page using the $(n+1)^{th}$ read voltage threshold and the data obtained by reading the flash memory page using the $m^{th}$ read voltage threshold to obtain joint data; and if a value on a data bit in the joint data is 1, determining the data bit as the first data bit.

In the embodiments, the data bit corresponding to different data may be quickly obtained using an exclusive OR method in order to effectively reduce a delay of error correction decoding.

Further, based on the foregoing embodiments, after the performing, according to an adjusted confidence level of the first data bit, error correction decoding on the data obtained by reading the flash memory page using the $(n+1)^{th}$ read voltage threshold, the method further includes, if the error correction decoding succeeds, modifying the $(n+1)^{th}$ read voltage threshold to a preset read voltage threshold; or if the error correction decoding fails, progressively increasing n by 1, and performing step 101 to step 104 in the foregoing first aspect again.

In the embodiments, when the decoding fails, step 101 to step 104 in the foregoing first aspect are performed again in order to effectively improve the success rate of error correction decoding.

Further, before step 101 to step 104 in the foregoing first aspect are repeatedly performed, whether a value obtained after n is progressively increased is greater than the preset threshold needs to be determined; and if the value obtained after n is progressively increased is not greater than the preset threshold, step 101 to step 104 in the foregoing first aspect are performed again, or if the value obtained after n is progressively increased is greater than the preset threshold, it is determined that a data block in which the flash memory page is located s a bad block.

In the embodiments, after the steps of all the embodiments are performed many times, if the decoding fails, a decoding process is ended, and an error is reported in order to prevent the data block from being used again next time.

Further, the performing, according to an adjusted confidence level of the first data bit, error correction decoding on the data obtained by reading the flash memory page using the $(n+1)^{th}$ read voltage threshold includes performing, using a low-density parity-check (LDPC) code, error correction decoding on the data obtained by reading the flash memory page using the $(n+1)^{th}$ read voltage threshold.

According to a second aspect, an embodiment of the present disclosure provides a flash memory error correction apparatus, including a read module, a determining module, a confidence value adjustment module, and a decoding module. Furthermore, the read module is configured to, after error correction decoding performed on data that is of a flash memory page and that is read using an $n^{th}$ read voltage threshold fails, read data of the flash memory page using an $(n+1)^{th}$ read voltage threshold, where the $(n+1)^{th}$ read voltage threshold is different from the $n^{th}$ read voltage threshold, and n is a positive integer greater than or equal to 1; the determining module is configured to determine a first data bit in the data obtained by reading the flash memory page using the $(n+1)^{th}$ read voltage threshold and data obtained by reading the flash memory page using an $m^{th}$ read voltage threshold, where the first data bit corresponds to different data respectively in the data obtained by reading the flash memory page using the $(n+1)^{th}$ read voltage threshold and the data obtained by reading the flash memory page using the $m^{th}$ read voltage threshold, and m is a positive integer greater than or equal to 1 and less than or equal to n; the confidence level adjustment module is configured to reduce a confidence level of the first data bit in the data obtained by reading the flash memory page using the $(n+1)^{th}$ read voltage threshold, where the confidence level is an absolute value of confidence corresponding to the first data bit; and the decoding module is configured to perform, according to an adjusted confidence level of the first data bit, error correction decoding on the data obtained by reading the flash memory page using the $(n+1)^{th}$ read voltage threshold.

In this embodiment, the apparatus is configured to perform the flash memory error correction method provided in the first aspect. An implementation principle and a beneficial effect of the apparatus are similar to those of the method provided in the first aspect, and details are not described herein.

Further, the determining module is further configured to determine a second data bit in the data obtained by reading the flash memory page using the $(n+1)^{th}$ read voltage threshold and the data obtained by reading the flash memory page using the $m^{th}$ read voltage threshold, where the second data bit corresponds to same data respectively in the data obtained by reading the flash memory page using the $(n+1)^{th}$ read voltage threshold and the data obtained by reading the flash memory page using the $m^{th}$ read voltage threshold; and the confidence level adjustment module is further configured to improve a confidence level of the second data bit in the data obtained by reading the flash memory page using the $(n+1)^{th}$ read voltage threshold.

Further, the determining module is configured to perform an exclusive OR operation on the data obtained by reading the flash memory page using the $(n+1)^{th}$ read voltage threshold and the data obtained by reading the flash memory page using the $m^{th}$ read voltage threshold to obtain joint data; and if a value on a data bit in the joint data is 1, determine the data bit as the first data bit.

Further, the apparatus includes a modification module, where the modification module is configured to determine whether the decoding module successfully performs the error correction decoding; and if the decoding module successfully performs the error correction decoding, the modification module is further configured to modify the $(n+1)^{th}$ read voltage threshold to a preset read voltage threshold; or if the decoding module fails to perform the error correction decoding, the modification module is further configured to send an instruction message to the read module, where the instruction message is used to instruct the read module to read the data of the flash memory page again, and n is progressively increased by 1.

Further, the modification module is configured to, before sending the instruction message to the read module, determine whether a value obtained after n is progressively increased is greater than the preset threshold; and if the value obtained after n is progressively increased is not greater than the preset threshold, send the instruction message to the read module; or if the value obtained after n is progressively increased is greater than the preset threshold, determine that a data block in which the flash memory page is located is a bad block.

Further, the decoding module is configured to perform, using a LDPC code, error correction decoding on the data obtained by reading the flash memory page using the $(n+1)^{th}$ read voltage threshold.

According to the flash memory error correction method and apparatus provided in the embodiments of the present disclosure, the method includes first, after the error correction decoding performed on the data that is of the flash memory page and that is read using the $n^{th}$ read voltage threshold fails, reading the data of the flash memory page using the $(n+1)^{th}$ read voltage threshold, where the $(n+1)^{th}$ read voltage threshold is different from the $n^{th}$ read voltage threshold, and n is the positive integer greater than or equal to 1; next, determining the first data bit in the data obtained by reading the flash memory page using the $(n+1)^{th}$ read voltage threshold and the data obtained by reading the flash memory page using the $m^{th}$ read voltage threshold, where the first data bit is a data bit corresponding to different data in the data obtained by reading the flash memory page using the $(n+1)^{th}$ read voltage threshold and the data obtained by reading the flash memory page using the $m^{th}$ read voltage threshold, and m is the positive integer greater than or equal to 1 and less than or equal to n; then, reducing the confidence level of the first data bit in the data obtained by reading the flash memory page using the $(n+1)^{th}$ read voltage threshold, where the confidence level is the absolute value of the confidence corresponding to the first data bit; and finally, performing, according to the adjusted confidence level of the first data bit, error correction decoding on the data obtained by reading the flash memory page using the $(n+1)^{th}$ read voltage threshold.

The two pieces of data obtained by reading the same flash memory page twice are jointly used, and the confidence level of the data bit corresponding to different data is reduced in order to effectively improve the success rate of error correction decoding and reduce the read delay, thereby significantly improving the performance of the SSD storage system.

BRIEF DESCRIPTION OF DRAWINGS

To describe the technical solutions in the embodiments of the present disclosure or in the other approaches more clearly, the following briefly describes the accompanying drawings required for describing the embodiments or the other approaches. The accompanying drawings in the following description show some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Solid-state storage has long been applied to storage of enterprise high-value data and storage of consumer electronic products. However, as an enterprise-class storage application becomes increasingly complex, a conventional storage array is gradually challenged in the following several aspects.

(1) Reliability. Limited by a mechanical component of a hard disk drive (HDD), an annualized failure rate of a single HDD is difficult to continue to be effectively reduced. This hinders further improvement of the reliability of the storage array.

(2) Performance. The conventional array obtains a relatively high read/write speed by accumulating a large quantity of HDDs, but cannot effectively reduce a read/write delay. In addition, with continuous expansion of data center virtualization, a read/write data model received by the conventional array is increasingly random, and is increasingly difficult to make targeted optimization.

(3) Cost. An enterprise usually obtains a required read/write speed by accumulating HDDs. In an actual application, this results in many extra capacity costs, and space and energy consumption costs that are required for supporting the large quantity of HDDs.

Based on the foregoing problems, a flash memory appears, and provides a possibility to resolve the foregoing problems. Currently, because the flash memory achieves relatively leading balance in multiple aspects, such as a price, a capacity, and reliability, the flash memory is widely applied to the field of the solid-state storage.

Core components of a flash memory-based SSD are a flash memory and a primary controller. The flash memory is a basic storage unit, and the primary controller is a heart of the SSD and is responsible for an operation and task allocation. A combination of the flash memory and the primary controller truly reflects performance of the SSD. If a capability of the primary controller is insufficient, a high-speed access characteristic of the flash memory cannot be maximized, and if quality of the flash memory is relatively low, a strong capability of the primary controller is of no avail.

Figure 1:
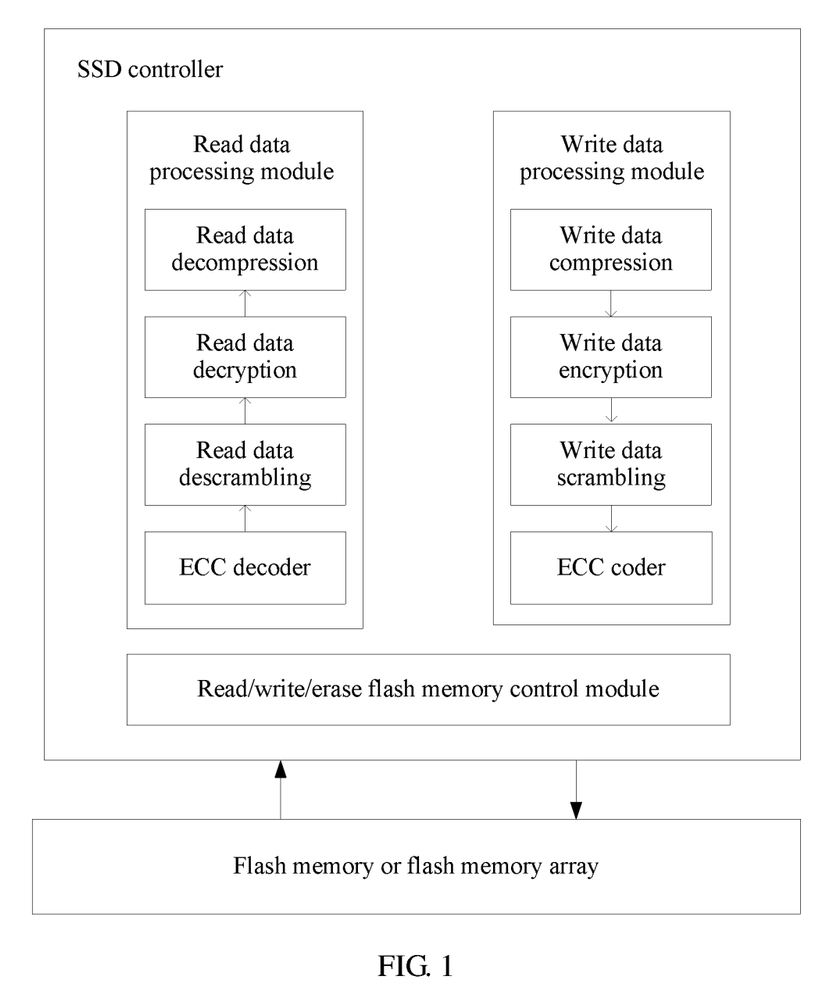
FIG. 1 shows a schematic diagram of a basic function module of an SSD controller.

FIG. 1 shows a schematic diagram of a basic function module of an SSD controller. As shown in FIG. 1, the SSD controller includes a write data processing module, a read data processing module, and a read/write/erase flash memory control module. The write data processing module completes processing operations such as compression, encryption, scrambling, and ECC coding of a data stream. Operations performed by the read data processing module are reverse processes of that performed by the write data processing module, and the read data processing module completes processing operations such as ECC decoding, descrambling, decryption, and decompression of data read from a flash memory. The read/write/erase flash memory control module completes functions of control of data reading from a flash memory particle, control of data writing, and control of data erasing. The SSD controller generally uses both an ECC coder and an ECC decoder as mandatory functions, and a purpose is to improve data reliability and life of the flash memory particle.

However, after a period of time, there may be multiple bit errors occurring in data stored in the flash memory. If data read from a flash memory physical page is directly returned to an upper-layer service, the service may fail. The SSD controller performs ECC protection on service data, that is, performs ECC coding on the service data, and then writes the data obtained after the ECC coding into the flash memory in order to ensure that the data returned to the upper-layer service is correct and valid. Each time reading the data, the SSD controller performs ECC on the data read from the flash memory in order to improve reliability of the service data. A conventional SSD controller is limited by a computing capability, and both ECC coding and ECC decoding used by the conventional SSD controller are extremely simple error-correcting codes, for example, a Bose-Chaudhuri-Hocquenghem (BCH) code. An error correction capability of the error-correcting code is limited, and can be effective only when a quantity of bit errors occurring in page data does not exceed a specific upper limit. For example, the conventional SSD controller usually uses a BCH code with an error correction capability of 24 bit/1 kilobyte (KB), and when a quantity of bit errors occurring in each 1 KB data (including service data and check data) does not exceed 24, the controller may obtain correct and valid service data by means of computation. After a quantity of bit errors occurring on a specific page exceeds the computing capability of the controller, service data of the page cannot be correctly read. In this case, an uncorrectable error is generated.

Currently, a high-capacity high-speed flash memory (NAND Flash) storage system is a hero product in the industry. However, in a current product application, a NAND flash storage medium has the following two major disadvantages.

(1) A physical characteristic of the NAND flash results in a phenomenon in which an error occurs in stored data; and (2) Frequent erase of the NAND flash results in phenomena of wearing and aging and limited life of a medium particle.

Therefore, in an application of an enterprise-oriented high-reliability storage product, a core technical challenge is to improve reliability and life of the NAND flash.

Figure 2:
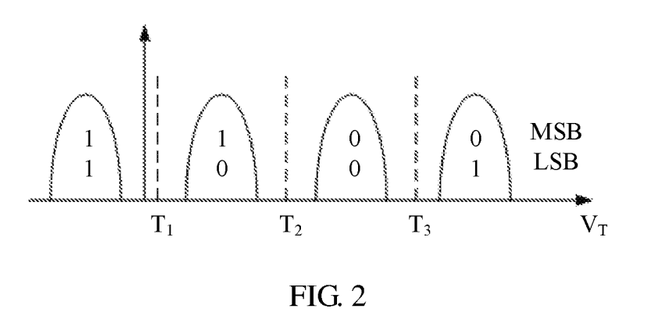
FIG. 2 shows an ideal voltage distribution status of a medium particle.

FIG. 2 shows an ideal voltage distribution status of a medium particle. In a normal case, voltage distribution of the medium particle should be in a form shown in FIG. 2, where T1, T2, and T3 are a read voltage threshold each.

However, an error occurs in the voltage distribution status of the medium particle for some reasons. Generally, there are the following two leading reasons for which an error occurs in the NAND flash medium.

Figure 3:
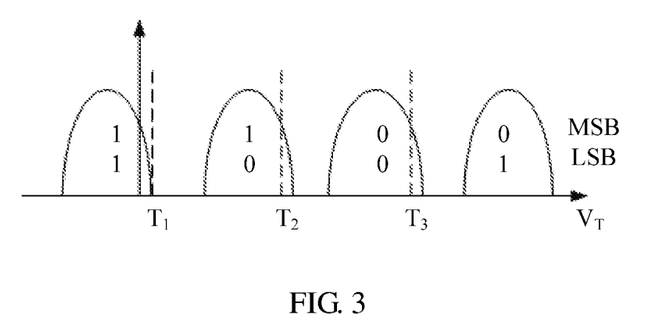
FIG. 3 shows a first actual voltage distribution status of a medium particle.

(1) With an increasing quantity of times of erasing the medium particle, because of programming interference between medium particles and the like in a programming process, the voltage distribution of the medium shifts. As shown in FIG. 3, because of the programming interference, the voltage distribution status of the medium particle shifts rightward with respect to the ideal voltage distribution status of the medium particle shown in FIG. 2. In this case, if the medium particle is read using an ideal read voltage threshold, a quantity of determining errors occurring during reading of the status of the medium particle is significantly increased.

Figure 4:
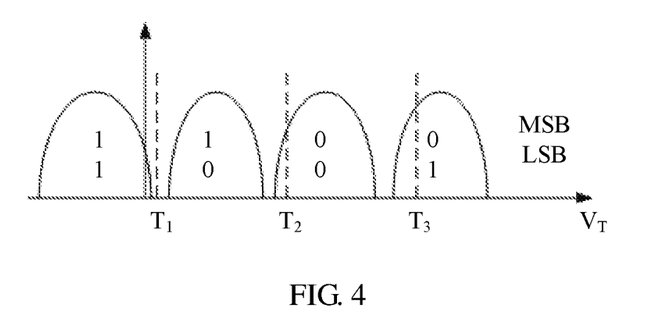
FIG. 4 shows a second actual voltage distribution status of a medium particle.

(2) With an increase of a placement time of the medium particle, because of leakage of an electron stored in the medium particle, the voltage distribution of the medium also shifts. As shown in FIG. 4, because the medium particle is placed for a long time, the voltage distribution status of the medium particle shifts rightward with respect to the ideal voltage distribution status of the medium particle shown in FIG. 2. Likewise, the quantity of determining errors occurring during reading of the status of the medium particle is also significantly increased.

Because of the shift phenomena of the voltage distribution that are caused by the foregoing two physical mechanisms, when the status of the medium particle is read using a fixed read voltage threshold, a determining error occurs. If a quantity of incorrect medium particles in read medium particles exceeds an error correction capability of an ECC error-correcting code, originally stored data information cannot be recovered using the error-correcting code, thereby causing a loss of the stored information. A data loss is disastrous in an enterprise-oriented storage product. Therefore, the industries use various technical means to improve data reliability of an SSD storage product in order to reduce a probability of a data loss to the most extent.

For the two reasons for the error, an error correction solution provided by a flash memory medium vendor is Read Retry, that is, a mechanism in which when the original information cannot be recovered using the error-correcting code after the status of the medium particle is read using a default read voltage threshold, the status of the medium particle is read again by adjusting a read voltage threshold and the original information is recovered using the error-correcting code.

In other approaches, an SSD controller may adjust the read voltage threshold of the medium particle many times using a Read Retry command in order to gradually approach a true voltage threshold of the medium particle. A fatal disadvantage of the solution is as follows: A quantity of times of reading the medium particle is increased in a Read Retry process. Consequently, a read delay is significantly increased, and finally performance of an SSD storage system is sharply degraded.

Figure 5:
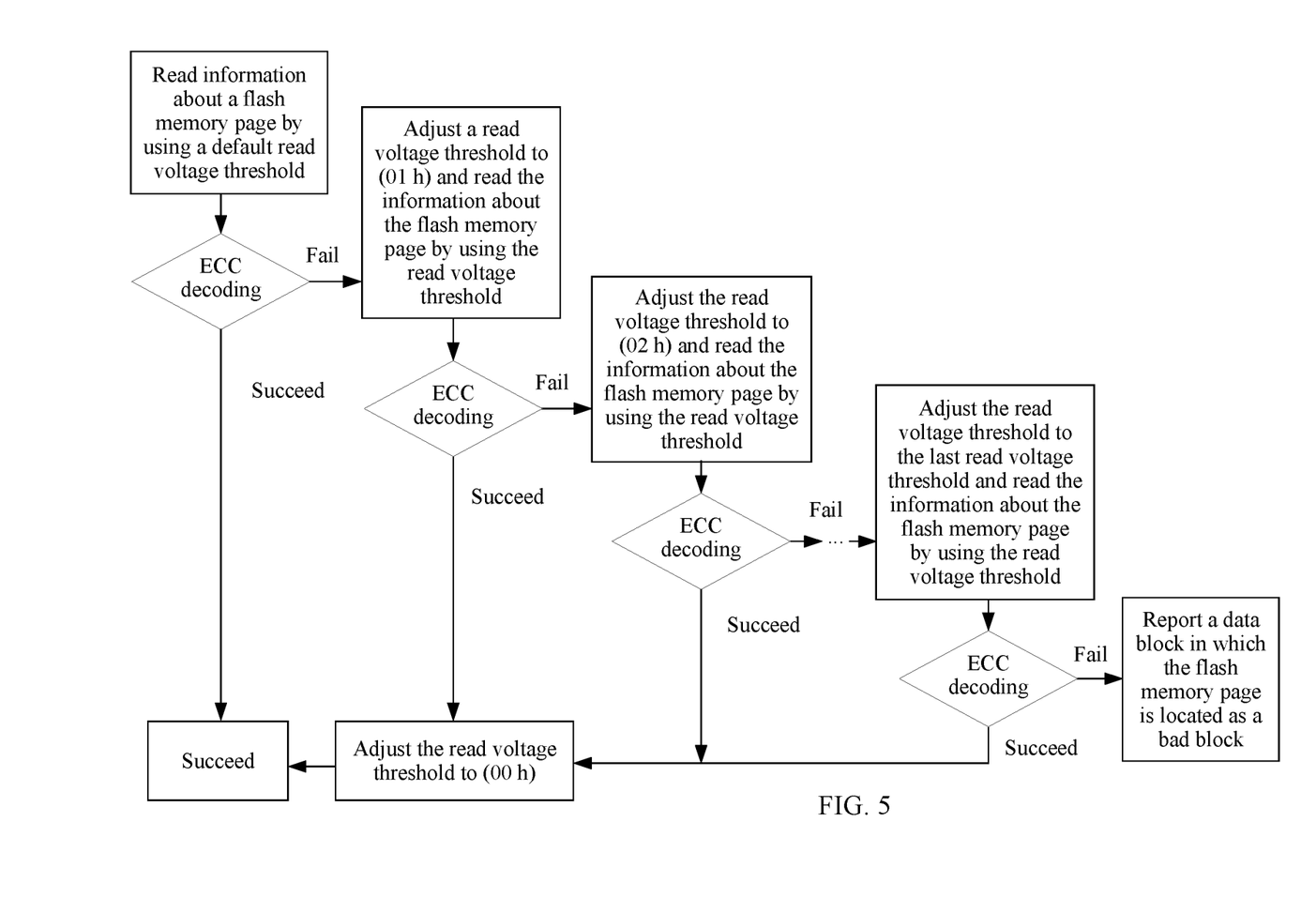
FIG. 5 shows a flowchart of a Read Retry-based error correction solution in other approaches.

FIG. 5 shows a flowchart of a Read Retry-based error correction solution in other approaches.

Step 1: Read each page of a flash memory medium using a default read voltage threshold, and perform ECC error correction decoding. If the decoding succeeds, an ECC decoding device feeds back a decoding success state and outputs correct original information; or if the decoding fails, an ECC decoding device performs step 2.

Step 2: If the ECC error correction fails in step 1, and an error is reported, read an incorrect page again after a read voltage threshold is adjusted to a read voltage threshold option 1 (01 h) according to a sequence in Table 1 (the sequence in the table is a default read threshold adjustment sequence given by Micron, or the sequence may be defined by a user according to an actual application scenario), and perform the ECC error correction decoding; and if the decoding succeeds, the ECC decoding device resets the read voltage threshold to the default read voltage threshold (an option 0), then feeds back a decoding success state, and outputs the correct original information; or if the decoding fails, the ECC decoding device performs step 3.

Step 3: If the ECC decoding device fails to correct the error again in step 2, read the incorrect page again after the read voltage threshold is adjusted to a read voltage threshold option 2 (02 h) according to the sequence in Table 1, and perform ECC error correction decoding; and if the decoding succeeds, the ECC decoding device resets the read voltage threshold to the default read voltage threshold (the option 0), and then feeds back a decoding success state, and outputs the correct original information; or if the decoding fails, the ECC decoding device performs step 4.

Step 4: If the decoding fails again in step 3, read the incorrect page again after the read voltage threshold is successively adjusted according to the read threshold selection sequences listed in Table 1, and perform ECC error correction decoding until the ECC decoding succeeds; and then, the ECC decoding device feeds back a decoding success state, and outputs the correct original information.

If the ECC decoding still fails after the SSD controller tries all the options listed in the following table, a decoding failure state is fed back, and a block (the block of the flash memory medium includes many pages) in which the page is located is marked as a bad block by an upper-layer management system of the SSD controller.

TABLE 1

Read Retry configuration table

| Option | Address | Purpose |
|---|---|---|
| 0 | 00 h | Default |
| 1 | 01 h | Data retention duration 1 |
| 2 | 02 h | Data retention duration 2 |
| 3 | 03 h | Data retention duration 3 |
| ... | ... | ... |

The following problems exist in the prior-art solution:

(1) In other approaches, a quantity of errors occurring in the read medium page is gradually reduced by traversing the read thresholds, and this method is used to attempt to enable the quantity of errors occurring in the medium page to satisfy an error correction capability of an ECC error correction device, but the error correction capability of the ECC error correction device is not essentially improved in this way.

For example, it is assumed that the error correction capability of the ECC error correction device is 1 KB/40 bit (that is, 40 bit errors may be corrected in 1 KB data). A quantity of bit errors occurring in 1 KB data expects to be less than 40 by adjusting the read voltage threshold in the Read Retry-based error correction mechanism.

(2) Because the error correction capability of the ECC error correction device is not essentially improved using the prior-art solution, the read voltage threshold needs to be adjusted many times to try to read data, thereby exponentially increasing a read delay (usually increasing from the order of microseconds to the order of milliseconds), and significantly degrading performance of an SSD storage system.

For this problem, the present disclosure provides a Read Retry-based error correction mechanism for improving the error correction capability. According to the solution, on the basis of other approaches, determining information obtained by reading a medium particle twice is jointly used, to obtain "soft information" from joint data obtained by reading the medium particle twice in order to improve the error correction capability of the ECC error-correcting code, and finally decrease a quantity of reading times of Read Retry, thereby reducing the read delay.

The following describes the solution of the present disclosure using specific embodiments.

Figure 6:
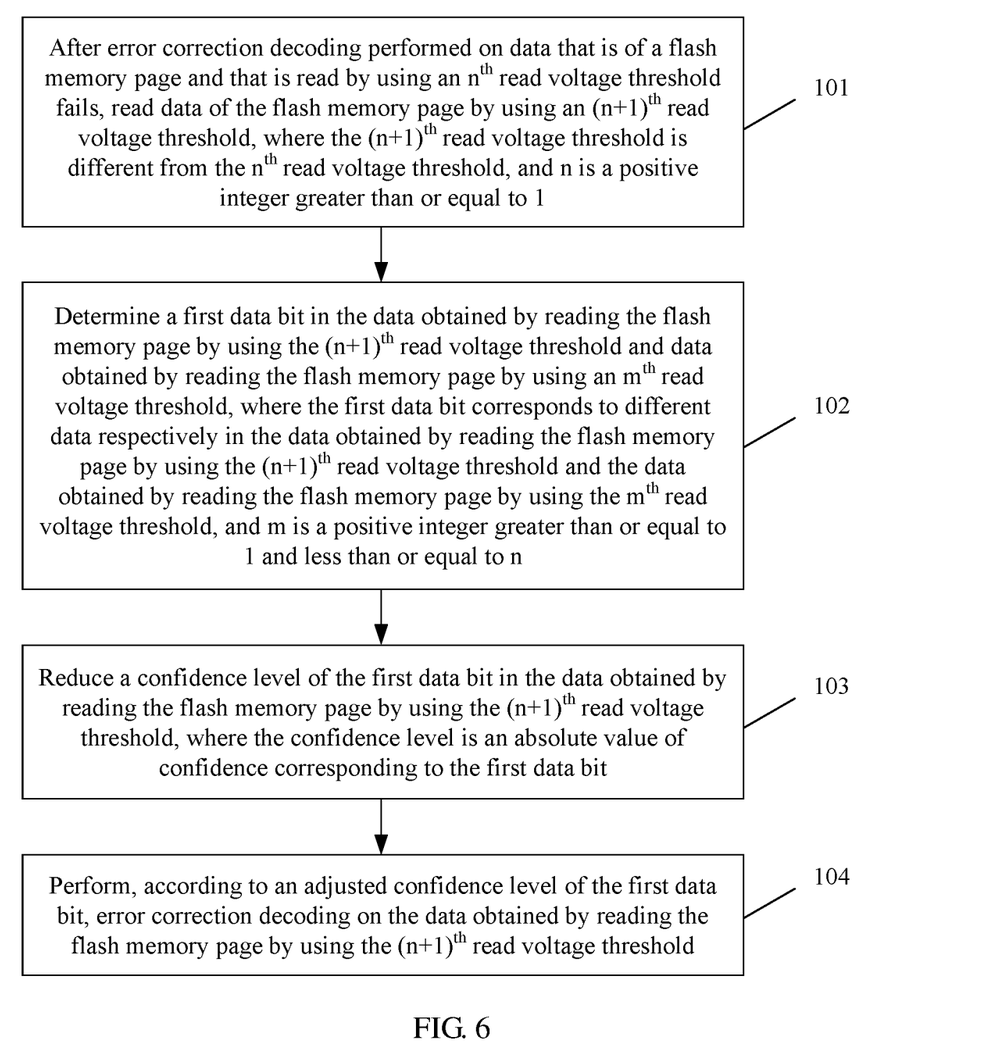
FIG. 6 shows a flowchart of a flash memory error correction method according to an embodiment of the present disclosure.

FIG. 6 shows a flowchart of a flash memory error correction method according to an embodiment of the present disclosure. As shown in FIG. 6, the method in this embodiment may include the following steps.

Step 101: After error correction decoding performed on data that is of a flash memory page and that is read using an $n^{th}$ read voltage threshold fails, read data of the flash memory page using an $(n+1)^{th}$ read voltage threshold, where the $(n+1)^{th}$ read voltage threshold is different from the $n^{th}$ read voltage threshold, and n is a positive integer greater than or equal to 1.

A value of the foregoing read voltage threshold may be adjusted according to an existing read voltage threshold table in other approaches, or may be set by a user. This is not limited in the present disclosure.

After the error correction decoding performed on the data that is of the flash memory page and that is read using the $n^{th}$ read voltage threshold fails, the data of the flash memory continues to be read using the $(n+1)^{th}$ read voltage threshold different from the $n^{th}$ read voltage threshold.

Step 102: Determine a first data bit in the data obtained by reading the flash memory page using the $(n+1)^{th}$ read voltage threshold and data obtained by reading the flash memory page using an $m^{th}$ read voltage threshold, where the first data bit corresponds to different data respectively in the data obtained by reading the flash memory page using the $(n+1)^{th}$ read voltage threshold and the data obtained by reading the flash memory page using the $m^{th}$ read voltage threshold, and m is a positive integer greater than or equal to 1 and less than or equal to n.

Step 103: Reduce a confidence level of the first data bit in the data obtained by reading the flash memory page using the $(n+1)^{th}$ read voltage threshold, where the confidence level is an absolute value of confidence corresponding to the first data bit.

For example, if the confidence is 0, ±1, ±2, ±3, and ±4, a corresponding confidence level is 0, 1, 2, 3, and 4.

In this embodiment of the present disclosure, for ease of description, the data obtained by reading the flash memory page using the $m^{th}$ read voltage threshold is referred to as $m^{th}$ data; and the data obtained by reading the flash memory page using the $(n+1)^{th}$ read voltage threshold is referred to as $(n+1)^{th}$ data. It should be noted that the $m^{th}$ data and the $(n+1)^{th}$ data are data obtained before error correction decoding is performed.

A bit corresponding to different data in the $m^{th}$ data and the $(n+1)^{th}$ data are determined, and a confidence level corresponding to the bit is reduced.

For example, if original data is 10101010, the $m^{th}$ data is 10111010 and the original data is not recovered after the error correction decoding is performed on the data, and the $(n+1)^{th}$ data is 10101010, it is determined that data on the fourth bit in the $m^{th}$ data and data on the fourth bit in the $(n+1)^{th}$ data are different, and data on another bit is the same. Therefore, a confidence level corresponding to the fourth bit may be reduced.

Continuing with the foregoing example, it is assumed that a confidence level corresponding to the fourth bit in the $(n+1)^{th}$ data is 3 (confidence is −3), the confidence level corresponding to the fourth bit in the $(n+1)^{th}$ data may be reduced to any confidence level, provided that the confidence level is less than 3 and greater than or equal to a minimum confidence level specified by a system, for example, the confidence level may be 1 or 2. However, in an actual application, the confidence level may be gradually reduced, that is, in this case, the confidence 3 corresponding to the fourth bit is reduced to 2.

The confidence may be obtained by means of confidence mapping.

The confidence is usually defined as a log-likelihood ratio of a probability that a logical value is 0 to a probability that a logical value is 1. For example, if the probability that the logical value is 0 is P, the probability that the logical value is 1 is 1−P, and the confidence is defined as $$LLR = \log \frac{p}{1-p}$$

according to the probabilities. The logical value is mapped to a quantitative value of the confidence by means of confidence mapping.

The quantitative value of the confidence may be represented using a user-defined quantization bit quantity according to a requirement. For example, if 4-bit quantization is used, where one bit represents a sign bit, and the remaining three bits represent an absolute value, the quantitative value of the confidence may represent a set of values of 0, ±1, ±2, ±3, ±4, ±5, ±6, ±7. Various convenient manners such as a table lookup may be used to complete mapping from the logical value to the value of the confidence using the confidence mapping. It should be noted that a larger absolute value of the confidence indicates a higher confidence level. Therefore, the confidence is a quantitative index for describing credibility of a determining value. It is also described herein that because the confidence level of the data corresponding to the fourth bit is low in the foregoing example, the confidence corresponding to the bit needs to be reduced in order to improve a success rate of error correction decoding.

In an actual application, if a bit corresponding to different data in the $m^{th}$ data and the $(n+1)^{th}$ data is obtained using one-to-one comparison method, a delay of a system is increased. Therefore, joint data may be obtained by performing an exclusive OR operation on the $m^{th}$ data and the $(n+1)^{th}$ data in order to directly determine, according to the joint data, a bit corresponding to same data and a bit corresponding to different data. That is, if a value on a data bit in the joint data is 1, it indicates that the data bit in the $m^{th}$ data and the $(n+1)^{th}$ data corresponds to different data; or if a value on a data bit in the joint data is 0, it indicates that the data bit in the $m^{th}$ data and the $(n+1)^{th}$ data corresponds to same data.

Continuing with the foregoing example, the $m^{th}$ data is 10111010, the $(n+1)^{th}$ data is 10101010, and the exclusive OR operation is performed on the $m^{th}$ data and the $(n+1)^{th}$ data, that is, 10111010 $\oplus$ 10101010=00010000. In the exclusive OR operation, if two values on which exclusive OR is performed are different, an exclusive OR result is 1; or if two values on which exclusive OR is performed are the same, an exclusive OR result is 0. Therefore, it may be easily learned, according to the foregoing exclusive OR result 00010000, that the fourth bits correspond to different data, and other bits correspond to the same data in order to improve processing efficiency of the system, and reduce a processing delay of the system.

Step 104: Perform, according to an adjusted confidence level of the first data bit, error correction decoding on the data obtained by reading the flash memory page using the $(n+1)^{th}$ read voltage threshold.

An error correction device performs error correction decoding on the $(n+1)^{th}$ data according to the adjusted confidence level of the first data bit. If the error correction decoding succeeds, in this case, the error correction decoding device resets the $(n+1)^{th}$ read voltage threshold to a preset read voltage threshold (that is, a default read voltage threshold), and then feeds back an error correction decoding success state, and outputs correct original information.

If the error correction decoding fails, the error correction decoding device modifies a read voltage threshold according to a preset rule, that is, the error correction decoding device progressively increases n in step 101 to step 104 to n+1, and performs steps 101 to 104 again.

Further, before repeatedly performing step 101 to step 104, the error correction decoding device needs to determine whether a value obtained after n is progressively increased is greater than the preset threshold; and if the value obtained after n is progressively increased is not greater than the preset threshold, the error correction decoding device performs step 101 to step 104 again, or if the value obtained after n is progressively increased is greater than the preset threshold, the error correction decoding device determines that a data block in which a current flash memory page is located is a bad block.

The preset threshold herein may be defined by a user, or may be preset by the system. This is not limited in the present disclosure.

In the present disclosure, the success rate of error correction decoding may be further improved by improving a confidence level of a second data bit in the data obtained by reading the flash memory page using the $(n+1)^{th}$ read voltage threshold and the data obtained by reading the flash memory page using the $m^{th}$ read voltage threshold, where the second data bit corresponds to same data respectively in the data obtained by reading the flash memory page using the $(n+1)^{th}$ read voltage threshold and the data obtained by reading the flash memory page using the $m^{th}$ read voltage threshold.

Continuing with the foregoing example, the data obtained by reading the flash memory page using the $m^{th}$ read voltage threshold is referred to as the $m^{th}$ data; and the data obtained by reading the flash memory page using the $(n+1)^{th}$ read voltage threshold is referred to as the $(n+1)^{th}$ data. It should be noted that the $m^{th}$ data and the $(n+1)^{th}$ data are the data obtained before the error correction decoding is performed.

A bit corresponding to same data in the $m^{th}$ data and the $(n+1)^{th}$ data is determined, and a confidence level corresponding to the bit is improved.

Before the confidence level corresponding to the bit is improved, the method may further include first determining whether the confidence level corresponding to the bit is a maximum confidence level; and if the confidence level corresponding to the bit is the maximum confidence level, skipping improving the confidence level corresponding to the bit, or if the confidence level corresponding to the bit is not the maximum confidence level, improving the confidence level corresponding to the bit.

For example, if the original data is 10101010, the $m^{th}$ data is 10111010 and the original data is not recovered after error correction decoding is performed on the data, and the $(n+1)^{th}$ data is 10101010, it is determined that data on the fourth bit in the $m^{th}$ data and data on the fourth bit in the $(n+1)^{th}$ data are different, and data on another bit is the same. Therefore, a confidence level corresponding to the fourth bit is reduced, and a confidence level corresponding to the another bit is improved.

Further, it is necessary to determine whether the confidence levels corresponding to the first bit, the second bit, the third bit, the fifth bit, the sixth bit, the seventh bit, and the eighth bit are the maximum confidence levels. In this case, it is assumed that confidence levels corresponding to the sixth bit and the eighth bit are the maximum confidence levels, there is no need to improve the confidence levels corresponding to the sixth bit and the eighth bit, and confidence levels corresponding to the first bit, the second bit, the third bit, the fifth bit, and the seventh bit are improved.

Likewise, a method for performing the exclusive OR operation on the $m^{th}$ data and the $(n+1)^{th}$ data may be used to obtain a bit corresponding to same data. An implementation of the method is similar to that of a method for describing a bit corresponding to same data in the $m^{th}$ data and the $(n+1)^{th}$ data in the foregoing embodiment, and details are not described herein again.

Table 2 is a statistical result obtained by measuring a NAND flash particle of Micron. It can be learned from the table that when quantities of erasing times are respectively 30 K, 32 K, 34 K, and 36 K, a decoding success frequency of the technical solution of the present disclosure is significantly higher than a single read information-based decoding success frequency of the prior-art solution. The improvement of the decoding success frequency of the technical solution in the present disclosure helps decrease a quantity of times of performing Read Retry by the SSD controller and reduce a read delay in order to improve performance of an SSD storage system.

TABLE 2

| Quantity of erasing times | Highest raw bit error rate on least significant bit pages | Highest raw bit error rate on most significant bit pages | Total decoding success percentage in a method of the present disclosure | Single decoding success probability |
|---|---|---|---|---|
| 36K | 1.08e−02 | 5.98e−03 | 91.3% | 67.04% |
| 34K | 9.22e−03 | 5.72e−03 | 94.73% | 15.23% |
| 32K | 8.54e−03 | 3.5e−03 | 96.58% | 28.37% |
| 30K | 7.04e−03 | 3.34e−03 | 98.44% | 48.97% |

Theoretical derivation and a simulation result indicate that two pieces of data obtained by reading a same flash memory page twice are jointly used, and extra soft information may be obtained by performing an operation on the two pieces of data; when the error correction device performs error correction decoding using the soft information, the error correction capability of the error correction device may be improved more than one time.

For example, for a byte with a code length of 4 KB, and an LDPC code with a bit rate of 94.57%, an error correction capability in single read is approximately 4 KB/65 bit (that is, 65 bit errors may be corrected in 4 KB data). After the soft information read twice is jointly used, the error correction capability may be improved to approximate 4 KB/144 bit (that is, 144 bit errors may be corrected in the 4 KB data). Therefore, the joint-twice error correction capability is 2.2 times of the single error correction capability.

According to the flash memory error correction method provided in this embodiment, the method includes, after the error correction decoding performed on the data that is of the flash memory page and that is read using the $n^{th}$ read voltage threshold fails, reading the data of the flash memory page using the $(n+1)^{th}$ read voltage threshold, where the $(n+1)^{th}$ read voltage threshold is different from the $n^{th}$ read voltage threshold, and n is the positive integer greater than or equal to 1; determining the first data bit in the data obtained by reading the flash memory page using the $(n+1)^{th}$ read voltage threshold and the data obtained by reading the flash memory page using the $m^{th}$ read voltage threshold, where the first data bit is a data bit corresponding to different data in the data obtained by reading the flash memory page using the $(n+1)^{th}$ read voltage threshold and the data obtained by reading the flash memory page using the $m^{th}$ read voltage threshold, and m is the positive integer greater than or equal to 1 and less than or equal to n; reducing the confidence level of the first data bit in the data obtained by reading the flash memory page using the $(n+1)^{th}$ read voltage threshold, where the confidence level is the absolute value of the confidence corresponding to the first data bit; performing, according to the adjusted confidence level of the first data bit, error correction decoding on the data obtained by reading the flash memory page using the $(n+1)^{th}$ read voltage threshold. The two pieces of data obtained by reading the same flash memory page twice are jointly used, and a confidence level of the data bit corresponding to different data is reduced in order to effectively improve the success rate of error correction decoding and reduce the read delay, thereby significantly improving the performance of the SSD storage system.

Figure 7:
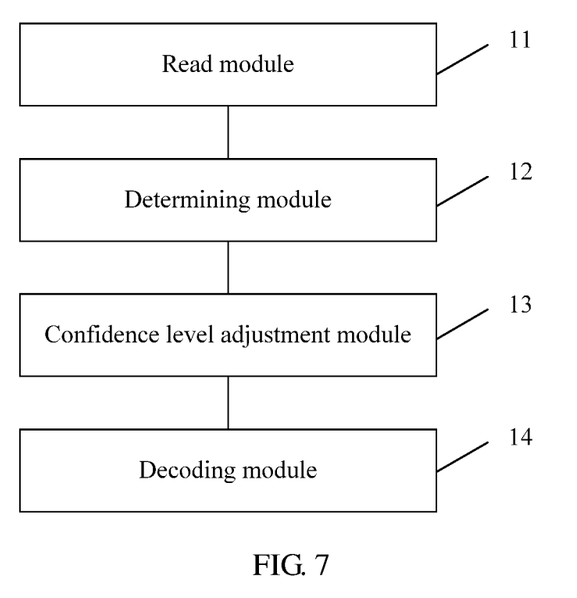
FIG. 7 shows a first schematic structural diagram of a flash memory error correction apparatus according to an embodiment of the present disclosure.

FIG. 7 shows a schematic structural diagram of a flash memory error correction apparatus according to an embodiment of the present disclosure. As shown in FIG. 7, the apparatus in this embodiment may include a read module 11, a determining module 12, a confidence level adjustment module 13, and a decoding module 14, where the read module 11 is configured to, after error correction decoding performed on data that is of a flash memory page and that is read using an $n^{th}$ read voltage threshold fails, read data of the flash memory page using an $(n+1)^{th}$ read voltage threshold, where the $(n+1)^{th}$ read voltage threshold is different from the $n^{th}$ read voltage threshold, and n is a positive integer greater than or equal to 1; the determining module 12 is configured to determine a first data bit in the data obtained by reading the flash memory page using the $(n+1)^{th}$ read voltage threshold and data obtained by reading the flash memory page using an $m^{th}$ read voltage threshold, where the first data bit corresponds to different data respectively in the data obtained by reading the flash memory page using the $(n+1)^{th}$ read voltage threshold and the data obtained by reading the flash memory page using the $m^{th}$ read voltage threshold, and m is a positive integer greater than or equal to 1 and less than or equal to n; the confidence level adjustment module 13 is configured to reduce a confidence level of the first data bit in the data obtained by reading the flash memory page using the $(n+1)^{th}$ read voltage threshold, where the confidence level is an absolute value of confidence corresponding to the first data bit; and the decoding module 14 is configured to perform, according to an adjusted confidence level of the first data bit, error correction decoding on the data obtained by reading the flash memory page using the $(n+1)^{th}$ read voltage threshold.

Optionally, based on the embodiment shown in FIG. 7, the determining module 12 is further configured to determine a second data bit in the data obtained by reading the flash memory page using the $(n+1)^{th}$ read voltage threshold and the data obtained by reading the flash memory page using the $m^{th}$ read voltage threshold, where the second data bit corresponds to same data respectively in the data obtained by reading the flash memory page using the $(n+1)^{th}$ read voltage threshold and the data obtained by reading the flash memory page using the $m^{th}$ read voltage threshold; and the confidence level adjustment module is further configured to improve a confidence level of the second data bit in the data obtained by reading the flash memory page using the $(n+1)^{th}$ read voltage threshold.

Further, the determining module 12 is configured to perform an exclusive OR operation on the data obtained by reading the flash memory page using the $(n+1)^{th}$ read voltage threshold and the data obtained by reading the flash memory page using the $m^{th}$ read voltage threshold to obtain joint data; and if a value on a data bit in the joint data is 1, determine the data bit as the first data bit.

Figure 8:
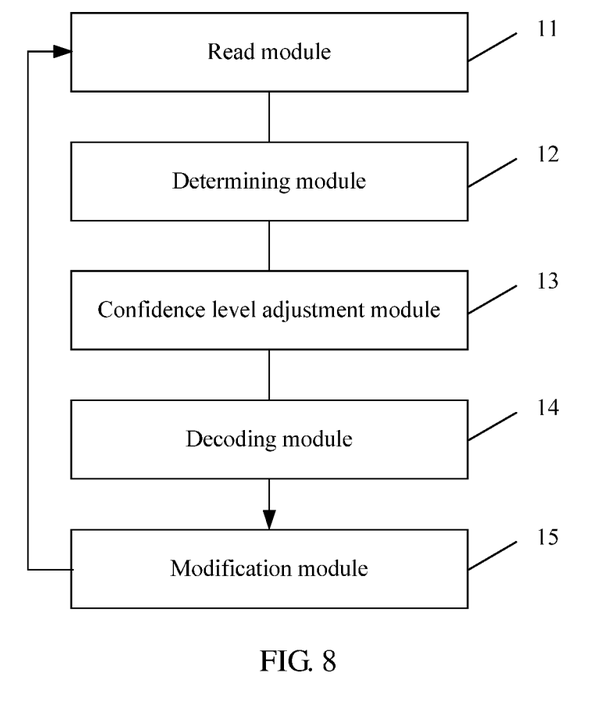
FIG. 8 shows a second schematic structural diagram of a flash memory error correction apparatus according to an embodiment of the present disclosure.

Optionally, based on the embodiment shown in FIG. 7, as shown in FIG. 8, the foregoing apparatus further includes a modification module 15, where the modification module 15 is configured to determine whether the decoding module successfully performs the error correction decoding; and if the decoding module successfully performs the error correction decoding, the modification module 15 is further configured to modify the $(n+1)^{th}$ read voltage threshold to a preset read voltage threshold; or if the decoding module fails to perform the error correction decoding, the modification module 15 is further configured to send an instruction message to the read module, where the instruction message is used to instruct the read module to read the data of the flash memory page again, and n is progressively increased by 1.

Optionally, the modification module is configured to, before sending the instruction message to the read module, determine whether a value obtained after n is progressively increased is greater than the preset threshold; and if the value obtained after n is progressively increased is not greater than the preset threshold, send the instruction message to the read module; or if the value obtained after n is progressively increased is greater than the preset threshold, determine that a data block in which the flash memory page is located is a bad block.

Optionally, the decoding module 14 is configured to perform, using a LDPC code, error correction decoding on the data obtained by reading the flash memory page using the $(n+1)^{th}$ read voltage threshold.

In this embodiment, the apparatus may be configured to perform the technical solution in the method embodiment shown in FIG. 6. An implementation principle and a technical effect of the apparatus are similar to those of the embodiment shown in FIG. 6, and details are not described herein again.

A person of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes any medium that can store program code, such as a read-only memory (ROM), a random access memory (RAM), a magnetic disk, an optical disc, a register, or a memory.

Finally, it should be noted that the foregoing embodiments are merely intended for describing the technical solutions of the present disclosure, but not for limiting the present disclosure. Although the present disclosure is described in detail with reference to the foregoing embodiments, a person of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A flash memory error correction method, comprising:
   determining that a first error correction decoding operation fails, wherein the first error correction decoding operation is performed on data of a flash memory page that is read using an $n^{th}$ read voltage threshold, and wherein n is a positive integer not less than two;
   reading the data of the flash memory page using an $(n+1)^{th}$ read voltage threshold to obtain $(n+1)^{th}$ data, wherein the $(n+1)^{th}$ read voltage threshold is different from the $n^{th}$ read voltage threshold;
   reading the data of the flash memory page using an $m^{th}$ read voltage threshold to obtain $m^{th}$ data, wherein the $m^{th}$ read voltage threshold is different from the $(n+1)^{th}$ read voltage threshold or the $n^{th}$ read voltage threshold, and wherein m is a positive integer less than n;
   comparing the $(n+1)^{th}$ data to the $m^{th}$ data to determine a first data bit that is different between the $(n+1)^{th}$ data and the $m^{th}$ data;
   reducing a first confidence level of the first data bit in response to determining that the first data bit is different between the $(n+1)^{th}$ data and the $m^{th}$ data, wherein the first confidence level is an absolute value of confidence corresponding to the first data bit; and
   performing, according to the first confidence level of the first data bit, a second error correction decoding operation on the $(n+1)^{th}$ data.

2. The flash memory error correction method of claim 1, further comprising:
   determining a second data bit that is the same between the $(n+1)^{th}$ data and the $m^{th}$ data; and
   improving a second confidence level of the second data bit in response to determining that the second data bit is the same between the $(n+1)^{th}$ data and the $m^{th}$ data.

3. The flash memory error correction method of claim 1, wherein comparing the $(n+1)^{th}$ data to the $m^{th}$ data comprises:
   performing an exclusive OR operation on the $(n+1)^{th}$ data and the $m^{th}$ data to obtain joint data; and
   determining a data bit in the joint data as the first data bit when a value of the data bit in the joint data is one.

4. The flash memory error correction method of claim 1, wherein after performing the second error correction decoding operation on the $(n+1)^{th}$ data, the method further comprises modifying the $(n+1)^{th}$ read voltage threshold to a preset read voltage threshold when the second error correction decoding operation succeeds.

5. The flash memory error correction method of claim 1, wherein after performing the second error correction decoding operation on the $(n+1)^{th}$ data, the method further comprises:
   increasing n by one when the second error correction decoding operation fails; and
   determining that a data block in which the flash memory page is located is a bad block when the value obtained after n is increased is greater than a preset threshold.

6. The flash memory error correction method of claim 1, wherein performing the second error correction decoding operation on the $(n+1)^{th}$ data comprises performing, using a low-density parity-check (LDPC) code, error correction decoding on the $(n+1)^{th}$ data.

7. The flash memory error correction method of claim 1, wherein the $m^{th}$ read voltage threshold is set according to a read voltage threshold table.

8. The flash memory error correction method of claim 1, wherein the $m^{th}$ read voltage threshold is set by a user.

9. A flash memory error correction apparatus, comprising:
   a memory configured to store program instructions; and
   a processor coupled to the memory, wherein the program instructions cause the processor to be configured to:
   determine that a first error correction decoding operation fails, wherein the first error correction decoding operation is performed on data of a flash memory page that is read using an $n^{th}$ read voltage threshold, and wherein n is a positive integer not less than two;
   read the data of the flash memory page using an $(n+1)^{th}$ read voltage threshold to obtain $(n+1)^{th}$ data, wherein the $(n+1)^{th}$ read voltage threshold is different from the $n^{th}$ read voltage threshold;
   read the data of the flash memory page using an $m^{th}$ read voltage threshold to obtain $m^{th}$ data, wherein the $m^{th}$ read voltage threshold is different from the $(n+1)^{th}$ read voltage threshold or the $n^{th}$ read voltage threshold, and wherein m is a positive integer less than n;
   compare the $(n+1)^{th}$ data to the $m^{th}$ data to determine a first data bit that is different between the $(n+1)^{th}$ data and the $m^{th}$ data;

reduce a first confidence level of the first data bit in response to determining that the first data bit is different between the $(n+1)^{th}$ data and the $m^{th}$ data, wherein the first confidence level is an absolute value of confidence corresponding to the first data bit; and perform, according to the first confidence level of the first data bit, a second error correction decoding operation on the $(n+1)^{th}$ data.

10. The flash memory error correction apparatus of claim 9, wherein the processor is further configured to:

determine a second data bit that is the same between the $(n+1)^{th}$ data and the $m^{th}$ data; and improve a second confidence level of the second data bit in response to determining that the second data bit is the same between the $(n+1)^{th}$ data and the $m^{th}$ data.

11. The flash memory error correction apparatus of claim 9, wherein the processor is further configured to:

perform an exclusive OR operation on the $(n+1)^{th}$ data and the $m^{th}$ data to obtain joint data; and determine a data bit in the joint data as the first data bit when a value of the data bit in the joint data is one.

12. The flash memory error correction apparatus of claim 9, wherein the processor is further configured to modify the $(n+1)^{th}$ read voltage threshold to a preset read voltage threshold when the second error correction decoding operation succeeds.

13. The flash memory error correction apparatus of claim 8, wherein the processor is further configured to:

increase n by one when the second error correction decoding operation fails; and determine that a data block in which the flash memory page is located is a bad block when the value obtained after n is increased is greater than a preset threshold.

14. The flash memory error correction apparatus of claim 9, wherein the processor is further configured to perform, using a low-density parity-check (LDPC) code, the second error correction decoding operation on the $(n+1)^{th}$ data.

15. A flash memory error correction system, comprising:

a flash memory configured to store data; and a controller coupled to the flash memory and configured to:

determine that a first error correction decoding operation fails, wherein the first error correction decoding operation is performed on data of a flash memory page that is read using an $n^{th}$ read voltage threshold, and wherein n is a positive integer not less than two;

read the data of the flash memory page using an $(n+1)^{th}$ read voltage threshold to obtain $(n+1)^{th}$ data, wherein the $(n+1)^{th}$ read voltage threshold is different from the $n^{th}$ read voltage threshold;

read the data of the flash memory page using an $m^{th}$ read voltage threshold to obtain $m^{th}$ data, wherein the $m^{th}$ read voltage threshold is different from the $(n+1)^{th}$ read voltage threshold or the $n^{th}$ read voltage threshold, and wherein m is a positive integer less than n;

compare the $(n+1)^{th}$ data to the $m^{th}$ data to determine a first data bit that is different between the $(n+1)^{th}$ data and the $m^{th}$ data;

reduce a first confidence level of the first data bit in response to determining that the first data bit is different between the $(n+1)^{th}$ data and the $m^{th}$ data, wherein the first confidence level is an absolute value of confidence corresponding to the first data bit; and perform, according to the first confidence level of the first data bit, a second error correction decoding operation on the $(n+)^{th}$ data.

16. The flash memory error correction system of claim 15, wherein the controller is further configured to:

determine a second data bit that is the same between the $(n+1)^{th}$ data and the $m^{th}$ data; and improve a second confidence level of the second data bit in response to determining that the second data bit is the same between the $(n+1)^{th}$ data and the m h data.

17. The flash memory error correction system of claim 15, wherein the controller is further configured to:

perform an exclusive OR operation on the $(n+1)^{th}$ data and the $m^{th}$ data to obtain joint data; and determine a data bit in the joint data as the first data bit when a value of the data bit in the joint data is one.

18. The flash memory error correction system of claim 15, wherein the controller is further configured to modify the $(n+1)^{th}$ read voltage threshold to a preset read voltage threshold when the second error correction decoding operation succeeds.

19. The flash memory error correction system of claim 15, wherein the controller is further configured to:

increase n by one when the second error correction decoding operation fails; and determine that a data block in which the flash memory page is located is a bad block when the value obtained after n is increased is greater than a preset threshold.

20. The flash memory error correction system of claim 15, wherein the controller is further configured to perform, using a low-density parity-check (LDPC) code, the second error correction decoding operation on the $(n+1)^{th}$ data.

* * * * *

UNITED STATES PATENT AND TRADEMARK OFFICE
CERTIFICATE OF CORRECTION

PATENT NO. : 10,691,535 B2
APPLICATION NO. : 15/965424
DATED : June 23, 2020
INVENTOR(S) : Yanxing Zeng, Jianqiang Shen and Gongyi Wang Page 1 of 1

It is certified that error appears in the above-identified patent and that said Letters Patent is hereby corrected as shown below:

In the Claims

Claim 13, Column 17, Line 28: "8, wherein" should read "9, wherein"

Claim 15, Column 18, Line 19: "on the $(n+)^{th}$ data." should read "on the $(n+1)^{th}$ data."

Claim 16, Column 18, Line 26: "the m h data." should read "the $m^{th}$ data"

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*